United States Patent [19]

Kashimura

[11] Patent Number: 5,254,848
[45] Date of Patent: Oct. 19, 1993

[54] IMAGE SENSOR AND METHOD OF READING DATA OUT OF THE SAME HAVING LOAD CAPACITORS BEING RESPECTIVELY CONTINUOUSLY CONNECTED TO COMMON SIGNAL LINES

[75] Inventor: Hirotsugu Kashimura, Kanagawa, Japan

[73] Assignee: Fuji Xerox Co., Ltd., Tokyo, Japan

[21] Appl. No.: 900,475

[22] Filed: Jun. 18, 1992

[30] Foreign Application Priority Data

Jun. 21, 1991 [JP] Japan .................. 3-175737

[51] Int. Cl.⁵ .......................... H01J 40/14
[52] U.S. Cl. .................. 250/208.1; 358/213.26; 257/443
[58] Field of Search .............. 250/208.1, 208.3, 578, 250/211 J, 211 R, 226; 358/213.11, 213.15, 213.18, 213.28, 213.16, 212, 213.31, 213.26; 357/30; 257/443

[56] References Cited

U.S. PATENT DOCUMENTS

| | | | |
|---|---|---|---|
| 4,565,928 | 1/1986 | Yamamoto et al. | 250/208.3 |
| 4,714,836 | 12/1987 | Kitamura et al. | 250/578 |
| 4,746,804 | 5/1988 | Kitamura et al. | 250/578 |
| 5,023,443 | 6/1991 | Komatsu et al. | 358/213.18 |
| 5,084,747 | 1/1992 | Miyawaki | 250/226 |

FOREIGN PATENT DOCUMENTS

58-62978  4/1983  Japan .

*Primary Examiner*—David C. Nelms
*Assistant Examiner*—Que T. Le
*Attorney, Agent, or Firm*—Finnegan, Henderson, Farabow, Garrett & Dunner

[57] ABSTRACT

An image sensor which has a simple construction, and can read a voltage value, not a current value, based on the quantity of light received by the photo diode, and can read charge of the light sensing elements every block. A plurality of light sensing elements each consisting of a photo diode and a blocking diode, make up a block. A plurality of blocks are arrayed. The blocking diodes are connected to a shift register for transferring a bias voltage thereto. The lead wires from the photo diodes are connected to common signal lines. The common signal lines are respectively connected to load capacitors. Potential caused in each common signal line by the charge stored in the corresponding load capacitor is read out.

4 Claims, 10 Drawing Sheets

IMAGE SENSOR AND METHOD OF READING DATA OUT OF THE SAME HAVING LOAD CAPACITORS BEING RESPECTIVELY CONTINUOUSLY CONNECTED TO COMMON SIGNAL LINES

FIELD OF THE INVENTION

The present invention relates to an image sensor used for the input unit of a facsimile device, an image scanner, or the like. More particularly, the invention relates to an image sensor including an array of a plurality of light-sensing elements each consisting of a photo diode and a blocking diode being connected in a back-to-back fashion, and a method of reading data out of the image sensor.

BACKGROUND OF THE INVENTION

There has been known an image sensor for reading an image on an original document, which is used for a facsimile device, for example. The image sensor includes a plurality of light sensing elements, which are linearly arrayed. Each light sensing element consists of a photo diode and a blocking diode being connected in a back-to-back fashion.

Figure 16:
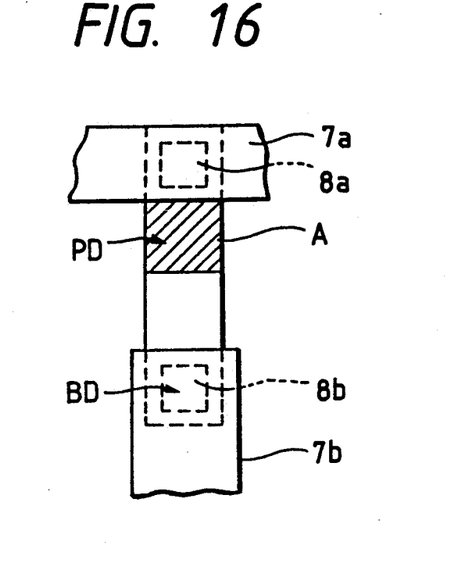
FIG. 16 is a diagram showing an equivalent circuit of a conventional type image sensor.
Figure 17:
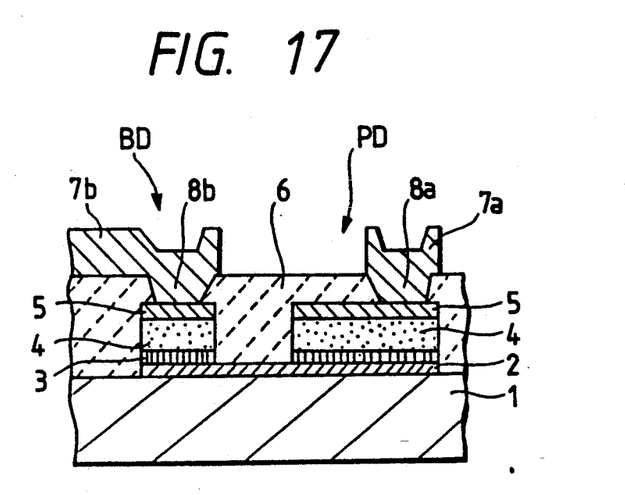
FIG. 17 is a plan view showing a light sensing element of the image sensor of FIG. 16.

As shown in FIGS. 16 and 17 which are a plan view and a sectional view showing a construction of the light sensing element in the image sensor, to form a photo diode PD and a blocking diode BD, the following layers are successively layered and patterned on a substrate 1 made of glass, for example; a metal electrode 2 made of chromium (Cr), for example, an ohmic contact layer 3 as an n+ layer, a photoconductive layer 4 made of hydrogenated amorphous silicon (a—Si, H), for example, a transparent electrode 5 made of indium-tin-oxide (ITO), for example, and an insulating layer 6 made of polyimide, for example. Lead wires 7a and 7b made of aluminum (Al), for example, are led from the diodes through contact holes 8a and 8b formed in the insulating layer 6.

An light receiving area A (shaded in the drawing), which receives light from above, is formed on the photo diode PD. The blocking diode BD is shielded from light by the lead wire 7b.

A plurality (n number) of light sensing elements thus constructed are disposed so as to form an array. The lead wires 7b led from each blocking diode BD is connected to a shift register SR as shown in an equivalent circuit of FIG. 18. The lead wire 7a led from each photo diode PD is grounded through a loading resistor R. An output terminal Tout is formed in the portion of the loading resistor R, which is closer to the photo diode.

The operation of reading charge out of the image sensor thus constructed will be described.

The photo diodes PD are scanned with the shift register SR. Through the scanning operation, a signal is applied to the photo diodes PD through the blocking diodes BD associated therewith, so that charge is stored into the photo diodes PD in successive manner.

During one cycle of the scanning operation, the photo diodes PD are exposed to light, so that the quantity of charge, which depends on the quantity of light received, is discharged from each photo diode. A reset signal (readout pulse signal) is successively applied to the diode series by the shift register. As a result, the quantity of charge corresponding to the quantity of discharge charge is stored again into the photo diodes.

At the time of recharge-up, current flows through a loading resistor R. The current is read out at the output terminal Tout, the form of a readout signal (Japanese Patent Laid-Open Publication No. Sho-58-62978).

The image sensor thus constructed and a method of reading out data from the image sensor suffers from noise problem for the following reason. The charge, which is caused to be discharged by the current flowing through the photo diode PD when a photo diode PD receives light, is distributed into the capacitor of the photo diode PD and the capacitor of the blocking diode BD. At this time, current flows through the loading resistor R for compensating for the reduction of the charge in the photo diode PD. This current causes noise.

To solve the problem, there is an image sensor constructed as below. A light sensing element includes a first photo diode PD not light-shielded and a second photo diode PD also not light shielded are closely disposed, and connected in a back-to-back fashion. A plurality of light sensing elements thus connected are linearly arrayed. The first and second photo diodes PD are designed such that the currents flowing through the diodes when these diodes are exposed to light, are equal to each other, whereby no current is leaked from the light sensing element.

Thus, in the image sensor, the two photo diodes (one of the diodes serves as a photo diode PD, and the other as a blocking diode BD) are connected in a back-to-back fashion. Aperture areas are formed in both the diodes, so that the currents flowing through the diodes when the diodes are exposed to light are equal to each other. As a result, current is leaked from the light sensing element, and hence the cause for generating noise is removed.

In the image sensor thus constructed, the current flowing through the loading resistor R at the time of recharge-up is read and it is used as an image signal. The circuit construction to read the current is more complicated than that to read the voltage. In a case where the charge of the light sensing elements in the image sensor is read out for each block, if the current read circuit is used, the circuit construction of it is more complicated. The image sensor of the current read type reads the current instantaneously. Accordingly, it is susceptible for noise. In other words, it is easily influenced by noise.

SUMMARY OF THE INVENTION

The present invention has been made in view of the above circumstances and has an object to provide an image sensor which has a simple construction, and can read a voltage value, not a current value, based on the quantity of light received by the photo diode, and can read charge of the light sensing elements every block.

An image sensor according to the first aspect of the invention, includes a light sensing element array including a plurality of blocks each consisting of a linear array of light sensing elements each consisting of a photo diode and a blocking diode being connected in back-to-back connection, common signal lines each connecting to the corresponding group of lead wires lead from the ends of the photo diodes in the light sensing elements, which are grouped for each block, a readout circuit connected to the common signal lines, and a shift register for transferring a readout pulse to the ends of the blocking diodes of the light sensing elements for each block. The image sensor is characterized in that load capacitors are, respectively, connected to the common signal lines.

A method of reading out data, according to second aspect of the invention, which is provided for solving the problem of the above case, reads data out of the image sensor, in which charge is distributed into the photo diode and the blocking diode according to the ratio of capacitance values thereof, when the light sensing elements are exposed to light, photocurrents flow therein according to the quantities of light, so that the photo diode and the blocking diode are discharged, the quantity of charge that is decreased as the result of the discharging operation is transferred to the load capacitor by turning on a bias voltage source contained in the shift register, and voltage, which is caused in each common signal line as the charge transfer to the load capacitor, is read out.

A method of reading out data, according to third aspect of the invention, reads data out of the image sensor, which is provided for solving the problem of the above case, in which charge is distributed into the photo diode and the blocking diode according to the ratio of capacitance values thereof, when the light sensing elements are exposed to light, photocurrents flow therein according to the quantities of light, so that the photo diode and the blocking diode are discharged, the quantity of charge that is decreased as the result of the discharging operation is transferred to the load capacitor by turning on a bias voltage source contained in the shift register, and voltage, which is proportional to the quantity of charge lost by the photocurrent flow, is left in the load capacitor by turning off the bias voltage source, whereby voltage is read out of the common signal line.

In the image sensor according to first aspect of the invention, a plurality of light sensing elements each consisting of a photo diode and a blocking diode make up a block. A plurality of blocks are arrayed into a light sensing element array. The blocking diodes are connected to a shift register for applying a bias voltage thereto. The lead wires from the photo diodes are connected to common signal lines each connecting to the light sensing elements within each block. The common signal lines are connected to a readout circuit. Each common signal line is provided with a load capacitor. With such an arrangement, the quantity of charge decreased as the result of the discharge by the photocurrent when the diode is exposed, is transferred to and stored in the load capacitor. Voltage caused in the common signal line by the charge of the load capacitor is read out for each block. The circuit construction for reading out the voltage is simpler than that for reading out the current.

In a method of reading out data, according to second aspect of the invention, charge is distributed into the photo diode and the blocking diode according to the ratio of capacitance values thereof. When the light sensing elements are exposed to light, photocurrents flow therein according to the quantities of light, so that the photo diode and the blocking diode are discharged. The quantity of charge that is decreased as the result of the discharging operation is transferred to the load capacitor by turning on a bias voltage source contained in the shift register. Voltage caused in each common signal line as the charge transfer to the load capacitor, is read out. The circuit construction for reading out the voltage is simpler than that for reading out the current. Further, the data readout operation for each block is easy.

In a method of reading out data, according to third aspect of the invention, charge is distributed into the photo diode and the blocking diode according to the ratio of capacitance values thereof, when the light sensing elements are exposed to light, photocurrents flow therein according to the quantities of light, so that the photo diode and the blocking lo diode are discharged, the quantity of charge that is decreased as the result of the discharging operation is transferred to the load capacitor by turning on a bias voltage source contained in the shift register, and voltage, which is proportional to the quantity of charge lost by the photocurrent flow, is left in the load capacitor by turning off the bias voltage source, whereby voltage is read out of the common signal line. The circuit construction for reading out the voltage is simpler than that for reading out the current. Further, the data readout operation for each block is easy.

DETAILED DESCRIPTION OF PREFERRED EMBODIMENTS

Image sensors according to embodiments of the present invention will be described with reference to the accompanying drawings.

Figure 1:
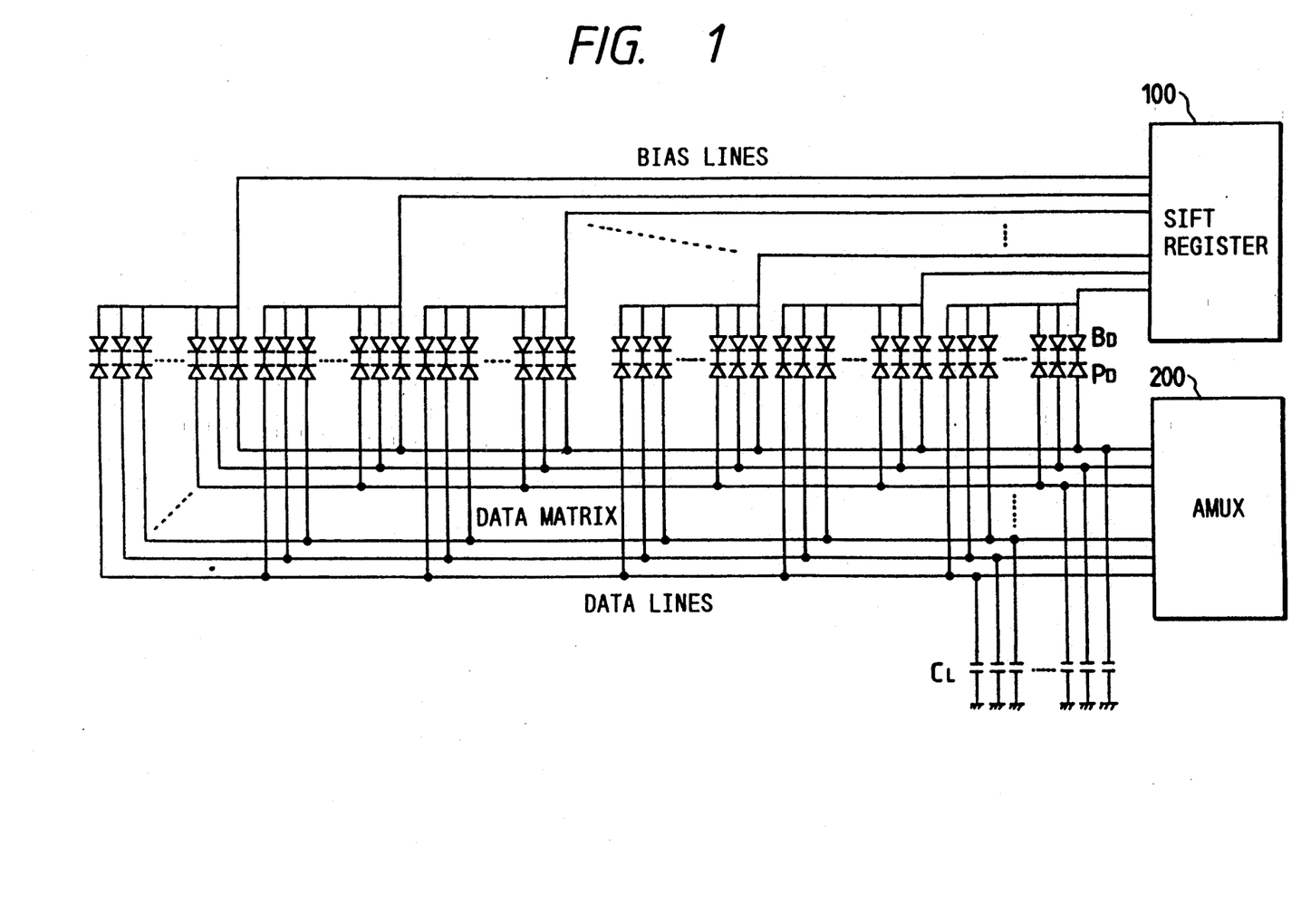
FIG. 1 is a diagram showing an equivalent circuit of a contact type image sensor according to an embodiment of the present invention.

FIG. 1 is an equivalent circuit of an image sensor according to an embodiment of the present invention. In the figure, like reference numerals and characters will be used for designating like or equivalent portions in FIGS. 16 through 18.

A contact type image sensor according to the embodiment of the invention is formed within one pixel area by large area electronic (LAE) process. This type of the image sensor is made up of a light-sensing array consisting of a plurality of blocks, bias lines for selecting the blocks, a plurality of data lines respectively connected to corresponding photo diodes PD in the blocks, and load capacitors (CL) respectively connected to the data lines. The blocks making up the light-sensing array each include a plurality of light sensing elements each consisting of a photo diode PD and a blocking diode BD connected in a back-to-back fashion.

Figure 18:
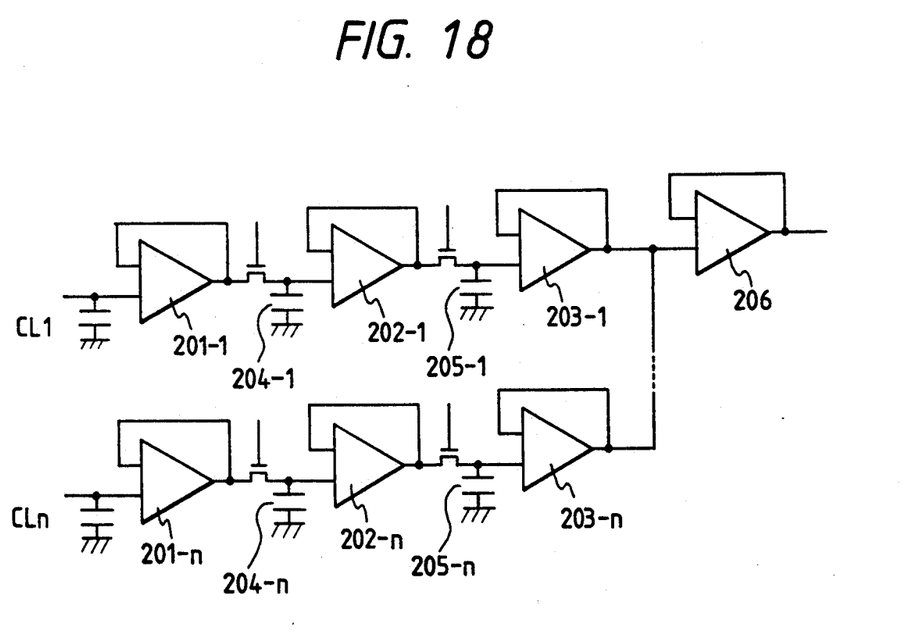
FIG. 18 a circuit diagram showing an analog multiplexer used in the embodiment of the invention.

The bias line is connected to a shift register 100. Each block is selected by a bias signal output from the shift register 100 at proper timings. The data line is connected an analog multiplexer 200. The analog multiplexer 200, as shown in FIG. 18, includes three stages of amplifiers 201-1 to 203-1 ... 201-$n$ to 203-$n$, stages of capacitors 204-1, 205-1 ... 204-$n$ to 205-$n$, and an output voltage follower 206. The circuit thus arranged amplifies the signal read out of the light sensing array, offset corrects it, and outputs it in the serial form. The analog multiplexer 200 is provided with a reset switch for resetting load capacitors, not shown.

Figure 2:
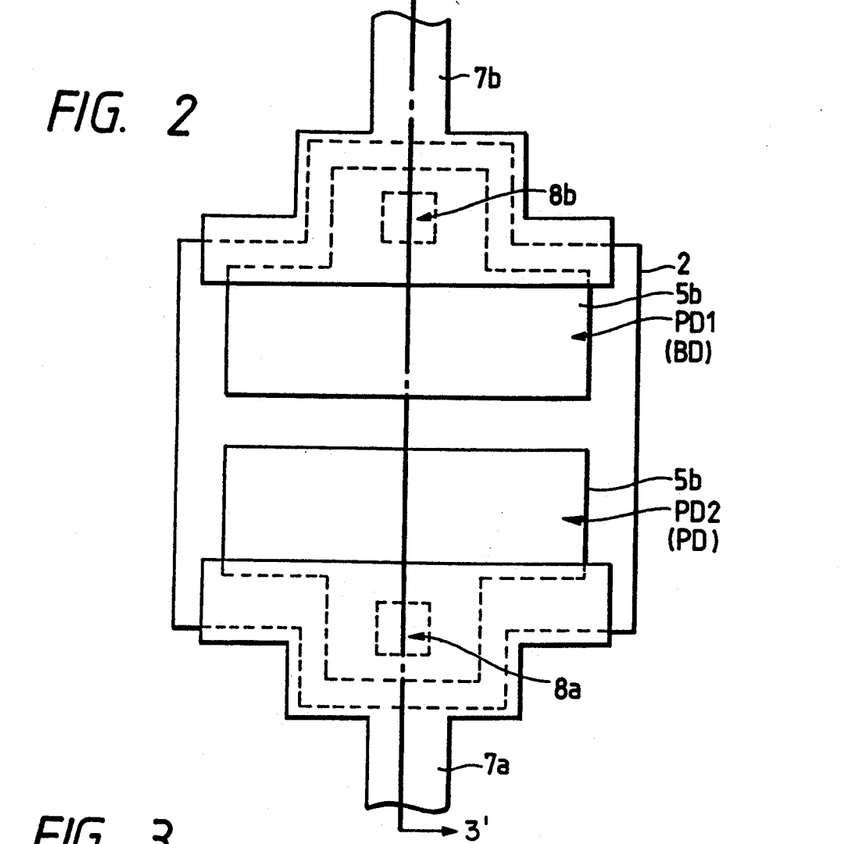
FIG. 2 is a plan view showing a light sensing element of the image sensor of the embodiment.

The photo diode PD and the blocking diode BD of the light sensing element are constructed such that they receive the quantities of light according to the ratio of their capacitance values. A specific example of the light sensing element to realize the construction is shown in FIG. 2. As shown, the photo diode PD and the blocking diode BD are constructed so as to have the equal light receiving areas, and to receive the equal quantities of light.

Figure 3:
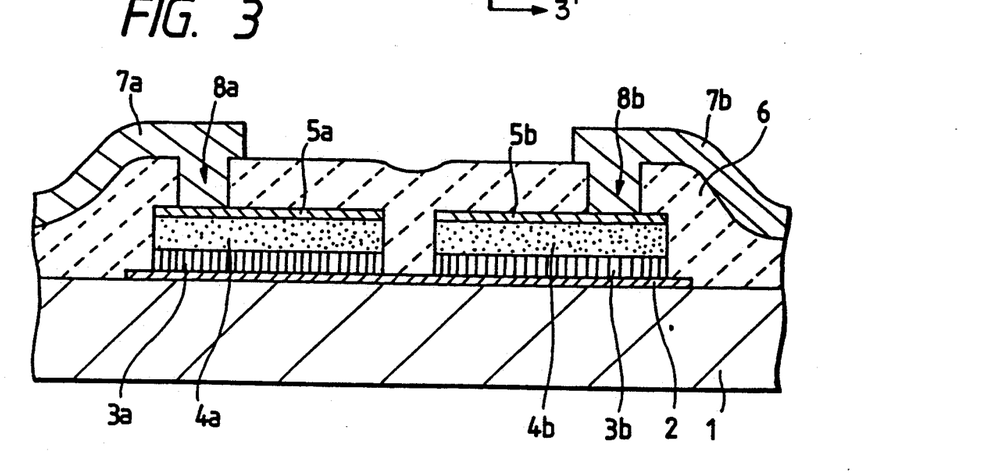
FIG. 3 is a cross sectional view taken on line 3'—3' in FIG. 2.

The light sensing element of the present embodiment will be described in detail with reference to FIGS. 2 and 3. FIG. 2 is a plan view showing the diode pair, and FIG. 3 is a cross sectional view taken on line 3'—3' in FIG. 2.

To manufacture the light sensing element in the present embodiment, the following layers are successively layered and patterned on a substrate 1 made of glass, for example; a metal electrode 2 made of chromium (Cr), for example, an ohmic contact layer 3 as an n+ layer, a photoconductive layer 4 made of hydrogenated amorphous silicon (a-Si:H), for example, a transparent electrode 5 made of indium tin oxide (ITO), for example, and an insulating layer 6 made of polyimide, for example. The structure is divided into two sections. The resultant ohmic contact layers 3, photoconductive layers 4, and transparent layers 5 are disposed to be horizontally symmetrical as shown in FIG. 2. Those sections serve as a photo diode PD and a blocking diode BD, respectively.

Lead wires 7a and 7b made of aluminum (Al), for example, are led from transparent electrodes 5a and 5b of the diodes PD and BD, through contact holes 8a and 8b formed in the insulating layer 6.

The lead wire 7b serves as a bias line for the blocking diode BD, and the lead wire 7a, as a data line for the photo diode PD.

The lead wire 7 forms a light-shielding pattern above the contact hole 8. The light shielding pattern defines a light receiving area. In the instant embodiment, the ratio of the light receiving areas of the diodes PD and BD is selected to be 1:1. For simplicity of explanation, the diodes are considered as simple switching elements, neglecting the diode characteristics.

The basic operations of the contact type image sensor thus constructed will be described with reference to FIGS. 4 through 10 for explaining the operation process. The operation will be described in connection with only one bit on a single data line, for ease of explanation.

Figure 4:
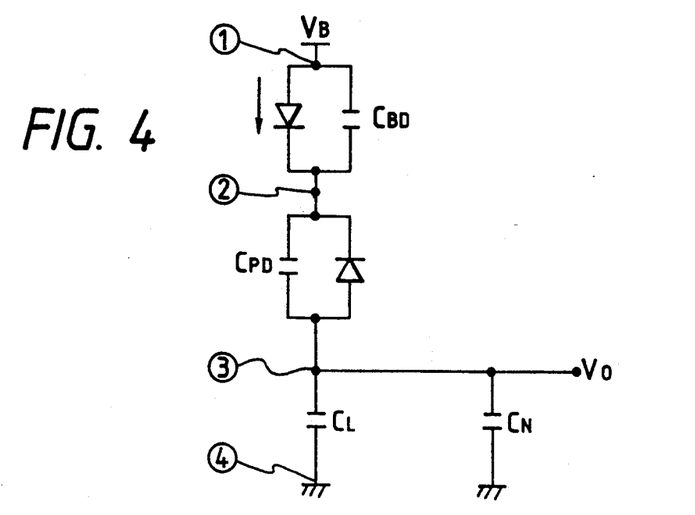
FIG. 4 is a diagram showing an equivalent circuit for explaining an operation process of the embodiment.

FIG. 4 is an equivalent circuit in an operation mode when the bias voltage source VB is turned on after power on. In the figure, a capacitor CN represents a combined capacitance of the pixels in other blocks connected to a data line. In this mode, a photo diode capacitor CPD and a load capacitor CL coupled with the data line are charged up. However, the capacitor CBD of the blocking diode BD is not charged up, viz., remains empty since it is forwardly biased.

In FIG. 4, voltage V24 between points (2) and (4) in FIG. 4 is equal to VB (V24=VB). Voltage V23 between points (2) and (3) and voltage V34 between points (3) and (4) are $$V23 = \{(CL+CN)/(CL+CN+CPD)\} \times VB$$

$$V34 = VO = \{CPD/(CL+CN+CPD)\} \times VB$$

where VO is the voltage on the output line Tout. Further, the combined pixel capacitance CN is $$CN = (number\ of\ all\ blocks - 1) \times CPD \times CBD/(CPD+CBD)$$

Figure 5:
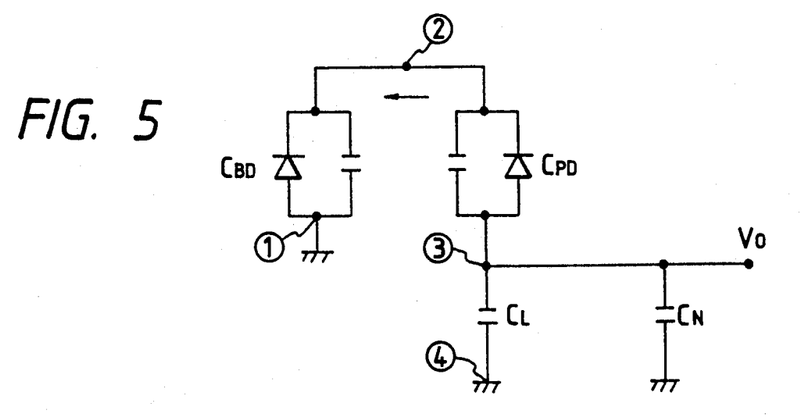
FIG. 5 is a diagram showing an equivalent circuit for explaining an operation process of the embodiment.

When the bias voltage source VB is turned off (at 0 V), the charge in the circuit of FIG. 4 is distributed again into the blocking diode capacitor CBD, photo diode capacitor CPD, load capacitor CL, and capacitor CN in accordance with the capacitance ratio of those capacitors, as shown in an equivalent circuit of FIG. 5. That is, the capacitor CBD of the blocking diode BD is charged up. The total capacitance CT of the equivalent circuit is given by the following equation.

$$CT = (CL+CN) \times CPD/(CL+CN+CPD)$$

The total charge quantity QT is expressed: QT=CT×VB. The voltage V12 between the points (1) and (2) and the voltage VO at the output are expressed $$V12 = QT/(CBD+CT)$$

$$VO = CPD/(CL+CN+CPD) \times V12$$

Figure 6:
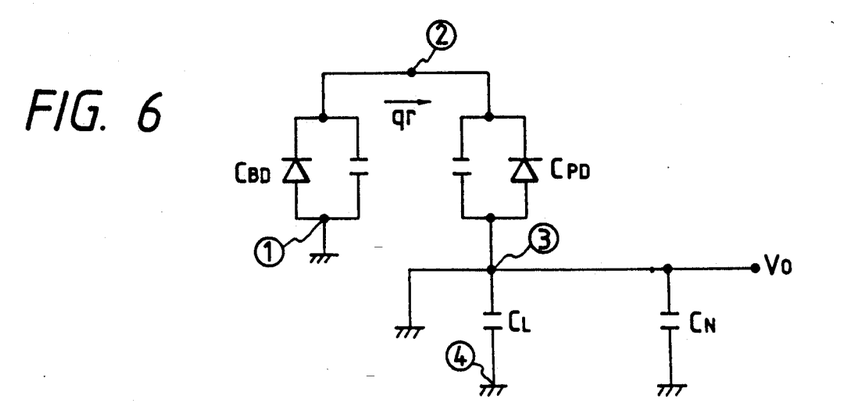
FIG. 6 is a diagram showing an equivalent circuit for explaining another operation process of the embodiment.

As shown in FIG. 6, after the bias voltage source VB is turned off, viz., after an arbitrary time elapses, a driver IC decreases the potential on the data line to ground (GND). The load capacitor CL is reset and discharged. The potential at point (3) drops to GND. Consequently, the quantity qr of the charge moves. The potential (denoted as VC) at the mid-point between the photo diode PD and the blocking diode BD is determined.

That is, the output potential VO is 0. As the result of the movement of the charge qr, the voltage V12(after reset) between the points (1) and (2) after reset is equal to the voltage V23(after reset) between the points (2) and (3) after reset; V12(after reset)=V23(after reset). The relationship between the voltage V12 before reset and the voltage 23 before reset, and the relationship between the voltage V12(after reset) after reset and voltage V23(after reset) after reset are expressed by the following equations $$V12(after\ reset) = V12 - qr/CBD$$

$$V23(after\ reset) = V23 - qr/CPD$$

The mid-point potential VC is given $$VC = V12(after\ reset) = V23(after\ reset)$$

A charge storage process caused by the photoelectric conversion, that is performed depending on the quantity of light applied, will be described with reference to FIG. 7. When the mid-point potential VC is set up through the process of FIGS. 4 to 6, both diodes PD and BD have been reversely biased. If under this condition, the diodes PD and BD thus biased are exposed to light, then current sources of the photo diode PD and the blocking diode BD feed photocurrents, which depends the quantity of light received. It is assumed that the capacitance CPD of the photo diode PD is equal to the capacitance CBD of the blocking diode, and that the quantities of light received On the light receiving areas of the photo diode PD and the blocking diode BD are equal to each other. Under the conditions thus assumed, the photocurrents IPD and IBD flowing into the photo diode PD and the blocking diode BD are equal; IPD=IBD.

Accordingly, the total quantities qPD and qBD of charge generated in the diodes PD and BD are equal to each other, during the period (storage time) TS from the instant that the load capacitor CL is reset after the bias voltage source is turned off till the bias voltage source is next turned off. That is, the photocurrents IPD and IBD cause the charge qPD and qBD. The charge in the capacitors CPD and CBD of the diodes PD and BD that have been stored through the process from the bias-on to the bias-off is discharged according to the charge quantities qPD and qBD, respectively. With this, the mid-point potential VC gradually decreases from the mid-point potential VCinit (it is the mid-point potential immediately after reset) to 0 (see the timing chart of FIG. 11).

Charge QPD in the photo diode PD and charge QBD of the blocking diode BD after the charge qPD and qBD is discharged, are expressed by $$QPD = CPD \times V23(after\ reset) - qPD$$

$$QBD = CBD \times V12(after\ reset) - qBD$$

Figure 7:
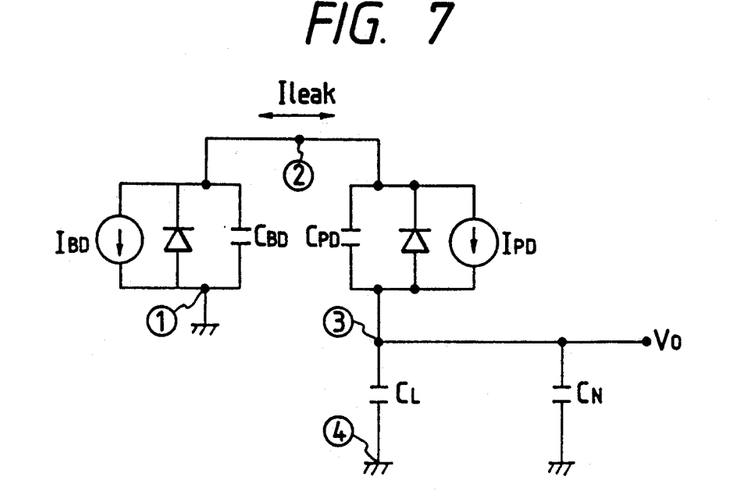
FIG. 7 is a diagram showing an equivalent circuit for explaining yet another operation process of the embodiment.

In FIG. 7, with the charge QPD of the photo diode PD and the charge QBD of the blocking diode BD, the bias voltage VPD of the blocking diode BD and the bias voltage VPD of the blocking diode BD are; VPD=QPD/CPD and VBD=QBD/CBD. Since qPD=qBD and CPD=CBD, VPD=VBD, V12(storage) (voltage between the points (1) and (2))=VPD=VBD. A new mid-point potential is set up, V12(storage)=VC. In this case, VPD=VBD, and hence the current Ileak, which flows at the mid-point (point (2)), is 0 (zero).

During the charge storage process, the mid-point voltage VC actually decreases proportionally with time. And after time TS elapsed, VPD=VBD=V12 (storage) is set up.

Figure 8:
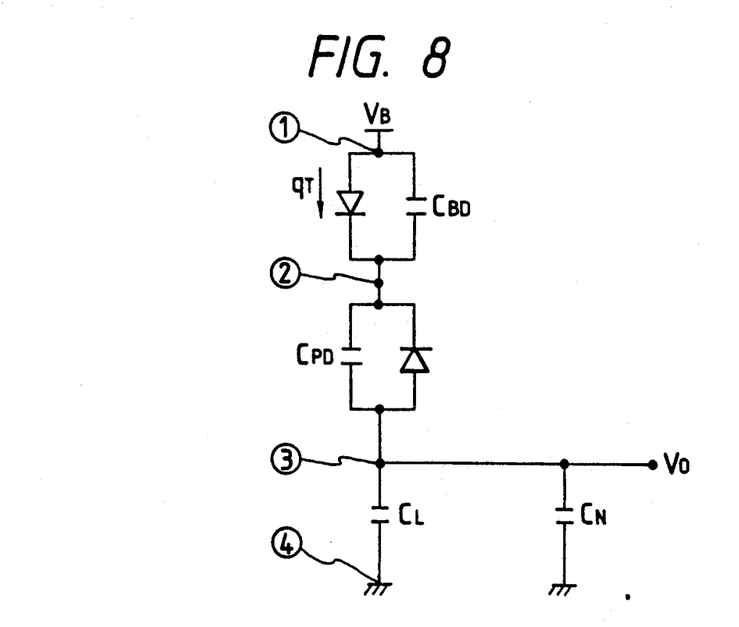
FIG. 8 is a diagram showing an equivalent circuit for explaining still another operation process of the embodiment.
Figure 9:
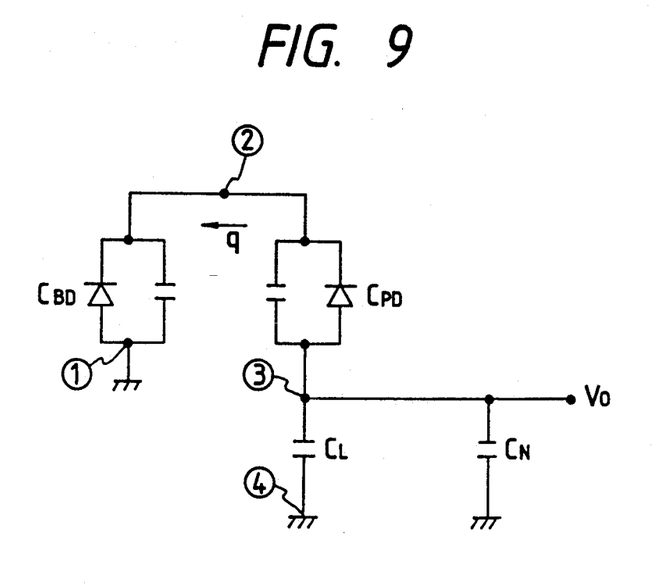
FIG. 9 is a diagram showing an equivalent circuit for explaining a further operation process of the embodiment.
Figure 10:
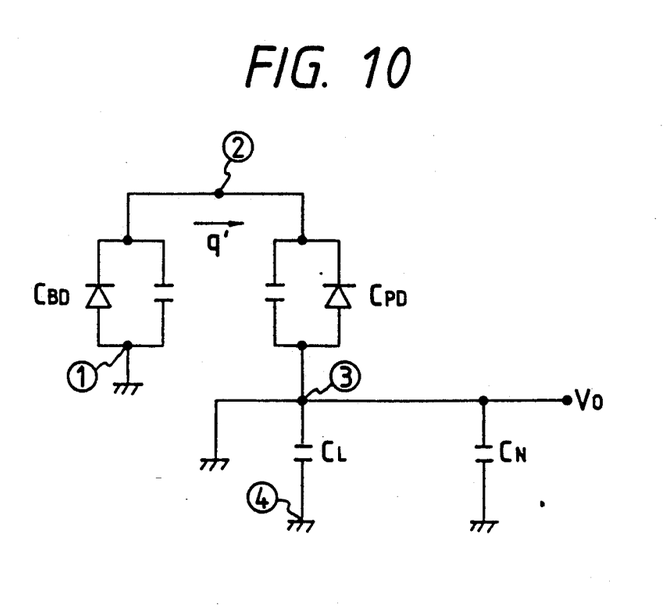
FIG. 10 is a diagram showing an equivalent circuit for explaining an additional operation process of the embodiment.

The charge generated in this process can be read out by repeating a process of FIGS. 8 through 10. This is substantially the same as the charge-up process of each capacitor as already described. Only difference of the former from the latter is that the quantity of the charge, which moves at the time of bias-on/off, is proportional to the charge quantities qPD and qBD.

Bearing the above in mind, let us consider the readout process with reference to FIGS. 8 to 10. As shown in FIG. 8, when the bias source is turned on, the charge qT flows at a certain time constant and the bias-on voltage VB appears at point B. Since the capacitor CPD of the photo diode, load capacitor CL, and capacitor CN are connected in series, the charge is increased by the charge quantity qT in the capacitors CPD, CL, and CN. That is, qT corresponds to qPD. The charge lost by photocharge in the photo diode PD is reflected in the charge quantity qT. The charge of qT is stored in the capacitors CL and CN in accordance with the ratio of their capacitance values.

Accordingly, the charge QCL, given by the following equation, is stored in the load capacitor CL.

$$\begin{aligned}QCL &= CL/(CN + CL) \times qT \\ &= CL/(CL + CN + CPD) \times \\ & \quad \{GPD - (Vb - Vc) + qPD\}\end{aligned}$$

When the bias voltage source is turned off, such charge q as to set up V12=V23 (V12 is the voltage between points (1) and (2), and V23 is the voltage between points (2) and (3)), moves at a certain time constant. Through the process of charge movement, the charge stored in the load capacitor CL and the capacitor CN is decreased by the charge quantity q. However, the quantity of charge, which is proportional to the charge qPD of the photo diode, is left in the load capacitor CL. The quantity of charge left in the load capacitor CL reflects the quantity qPD of charge, which is lost by photocharge in the photo diode PD. In the present embodiment, the voltage on a common signal line, which is caused by the charge left in the load capacitor CL, is read out. As a matter of course, it can be read out also when the bias source VB is turned on as shown in FIG. 8.

As the result of the movement of charge q, the capacitance values CPD, CBD, CL, and CN of the photo diode PD, blocking diode BD, and the charge QPD, QBD, and QCL are mathematically expressed by the following equation $$(QPD-q)/CPD+(QCL-q)/(CL+CN)=q/CBD$$

Rearranging the equation for charge q, we have $$q = CBD \times CPD \times (CL+CN)/ \\ \{(CL+CN) \times CBD + (CL+CN) \times CPD + CBD \times CPD\} \times VB$$

In this case, the bias voltages VPD and VBD of the diodes PD and BD are expressed; VPD=(QPD−q)/COD, and VBD=q/CBD. Voltage value VO(read) read out in FIG. 9 is $$VO(read) = CPD/(CL+CN+CPD) \times VPDG + B$$

where VPDG indicates the potential drop resulting from the photoelectric conversion. In the above equation, B is given by $$B = CPD/(CL+CN+CPD) \times VB - \{(CL+CN) \times CPD \times CBD\}/\{(CL+CN) \times CPD + (CL+CN) \times CBD + CPD \times CBD\} \times VB - CPD/(CL+CN+CPD) \times VC$$

This equation teaches that if the capacitance values of the respective capacitors are selected so that the B is substantially 0, the output signal is proportional to the quantity of light applied.

The voltage VO(VBON) read out at the bias-on (VBON) time is expressed as follows:

$$VO(BGON) = QCL/CL = CPD/(CL+CPD) \times (VB-VC+VPDG)$$

In the process that as shown in FIG. 8, after the reset off, upon block select, the bias voltage VG is applied, and the charge-up operation progresses, the charge generated simultaneously with the charge-up operation can be read out. Alternatively, the charge of the load capacitor CL can be read out after the bias voltage source is turned off, as shown in FIG. 9. The data readout method shown in FIG. 9 provides a value closer to the value of charge qPD lost by the photocharge in the photo diode PD. The FIG. 9 method charge is capable of reading out the charge, while canceling a field through caused through the turn-on process of the bias voltage V. In this respect, this readout method is a field-through killing readout method.

As seen from a circuit diagram shown in FIG. 10, when the reset is turned on and the bias voltage VB changes its state from an on-state to an off-state, the charge transferred to the load capacitor CL and the capacitor CN is discharged (QCL=0, QN=0). Charge c, moves from the blocking diode BD to the photo diode PD. The mid-point potential VC is initialized, and the reset is in an off state. A storage process is set up. This state is expressed by the following equation $$(QBD - q')/CBD = (QPD + q')/CPD$$

Rewriting the equation for q', then we have $$q' = CPD \times CBD/(CPD+CBD) \times VO(read)$$

In a process following the process of FIG. 10, the reset is in an off state. The photo diode PD and the blocking diode BD are exposed to light. Photocurrents flows therethrough, so that the charge is lost in both the diodes. The charge corresponding to the lost charge is read out by the process of FIGS. 8 through 10.

Its influence on one-bit data as mentioned above upon other pixels connected to the same data line will be described.

When a block is selected, the charge QN, which corresponds to the charge generated in the pixels in the block, is stored in the capacity CN. This is stored in the combined capacitance of the photo diode capacitance CPD and the blocking diode capacitance CBD of the pixels not selected, and has also been stored in those pixels. Accordingly, the mid-point potential VC has been decreased. On the other hand, the charge functions like an offset. When selection of a certain block in the previous readout process is completed, and the load capacitor CL is reset, the charge QN is also reset and as a consequence no influence is given to other pixels.

Figure 11:
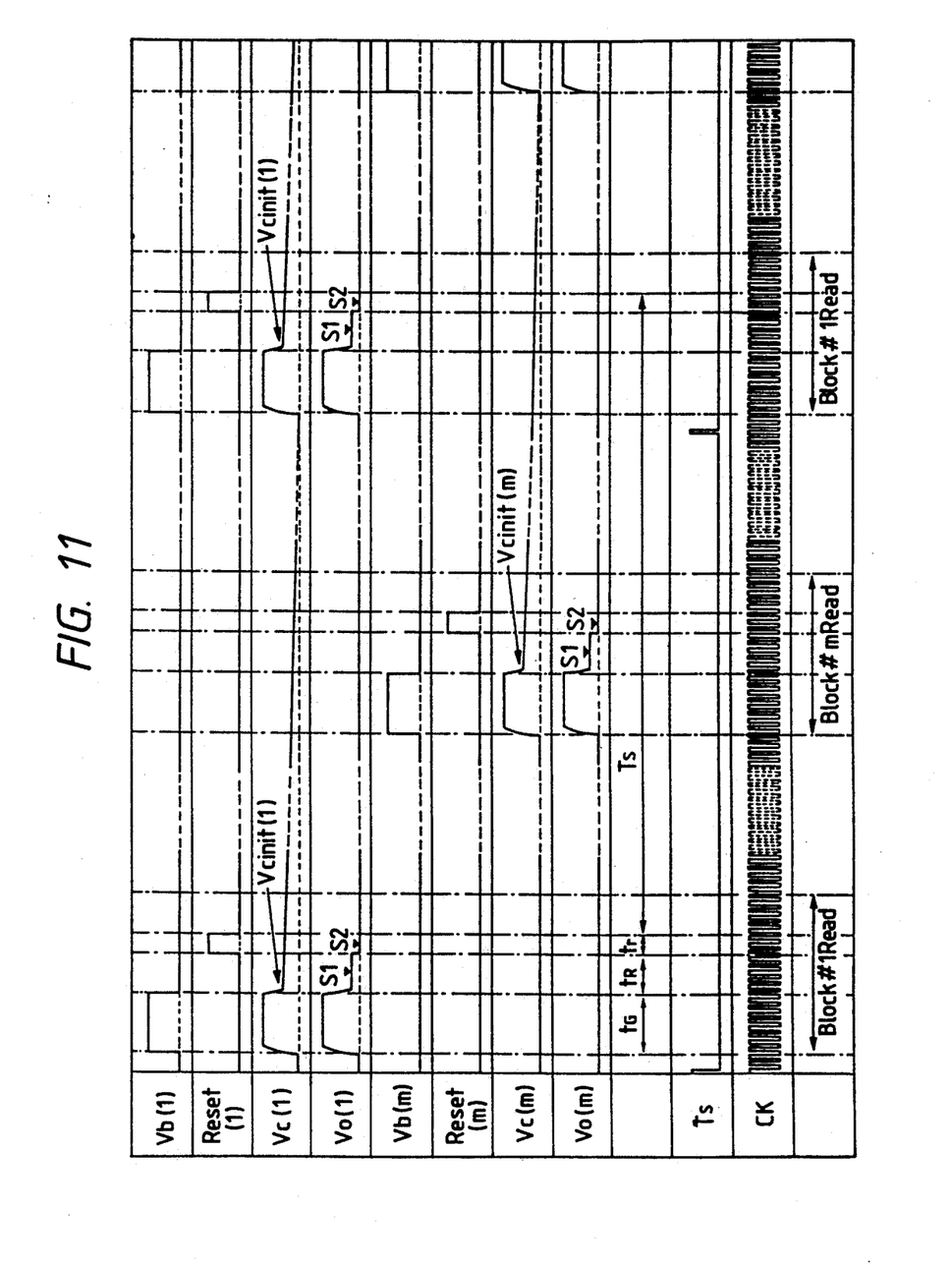
FIG. 11 is a timing chart showing the read operation of the image sensor.

FIG. 11 shows an example of a timing chart of the readout process as mentioned above. More specifically, the timing chart of FIG. 11 depicts the operation of reading out the output potential VO(read) in the circuit diagram showing the operation process of FIG. 9. In the figure, m indicates the number of blocks applied with a bias signal; VB(m), a bias signal for selecting the m-th block; VC(m), a mid-point potential of a certain pixel of the m-th block; Reset(m), a reset signal for the input capacitor of the m-th block; VO(m), an output signal of a certain pixel of the m-th block; and Ts and Ck, a timing signal and a clock signal for defining a storage time. The operation timing will be described for the first block as an example. When a 1st block select signal VB(1) goes high (+5 V, in this instance) during a period tG, the quantity of charge equal to that lost in the previous exposure to light, upon driving the blocking diodes, move to all the pixels (64 pixels in this instance) within the first block. as a result, the voltage VC(1) of those pixels is pulled up to approximately VB(1). The charge moves to the load capacitors CL of the data lines, too. Accordingly, potential VO(1) appears across each load capacitor CL (FIGS. 4 and 8). When voltage VB(1) goes low (0 V in this instance), the charge is redistributed to the photo diode PD and the blocking diode BD. The charge redistribution takes place in all of the pixels. $VC(1) \approx VB(1)/2 = VCinit(1)$ is set up (more strictly, this potential slightly changes at the time of reset on; however, this potential variation is negligible if the capacitance CL is sufficiently larger than the stray capacitance of the blocking diode BD and the photo diode PD). At this time, the mid-point potential VC(1) is equal to the storage start potential, and gradually decreases when the light sensing elements are exposed to light. The charge, which is proportional to the quantity of light received, is left in each load capacitor CL, so that potential VO(1) appears across the capacitor (FIGS. 5 and 9). At a proper time point (S1) within the period tR, the potential VO(1) in all the pixels is sampled and fed to the drive IC. After the VO(1) sampling, Reset(1) goes high (5 V in this instance) during the period tr, so that the load capacitor CL of all the pixels within the present block are reset (FIGS. 6 and 10) at any time point immediately before the next block is selected. Further, in the present embodiment, the potential is sampled again (S2) after the reset, and the offset correction is performed for each pixel within the drive IC. The sampling and correction operations are performed in order that if the signal (VO(1)) is amplified at high $\mu$-factor within the drive IC, the offset is not increased. Accordingly, in the present embodiment, the output Vcom after the pixel signals are multiplexed in the drive IC is equal to $G \times (S1-S2)$; $Vcom = G \times (S1-S2)$ where G is the total $\mu$-factor within the drive IC.

The readout operation of optical information is completed within the period $tG+tR+tr$. The timing of selecting the next block is determined allowing for the multiplexing timing within the drive IC. It is selected to be 64CK in the present embodiment.

The description thus far made is based on the assumption that CPD=CBD and IPD=IBD. In a state of actually reading an original document, the photo diode PD and the blocking diode BD do not always receive the equal quantity of light. In this instance, the photo diode PD and the blocking diode BD are formed within an area of one pixel. Therefore, the influence by the inequality of the quantities of received light is negligible. In this respect, the image sensor of the invention suffices for application to facsimile devices, for example. However, a situation that the quantities of light applied to both diodes are not equal to each other actually occurs. The influence in such a situation will be described.

In FIG. 7, if IPD≠qBD, qPD≠vBD holds after time TS, then, vPD≠vBD and dV=vPD−vBD≠0. Leak current Ileak flows so as to remove the potential difference. Accordingly, also in modes other than a read mode, the charge flows, which depends on the ratio of the capacitors CL and CN. This functions as noise in reading the charge in other blocks. It is possible to read out the charge, which corresponds to the received light, if in design stage, the load capacitance CL is optimized allowing for the quantity of noise.

In operation, an analog multiplexer (AMUX) in an equivalent circuit of FIG. 1 reads out data on data lines for each block at one time according to the timings shown in FIG. 11, and converts the parallel data into serial data, and thereafter rests all the data lines.

Figure 12:
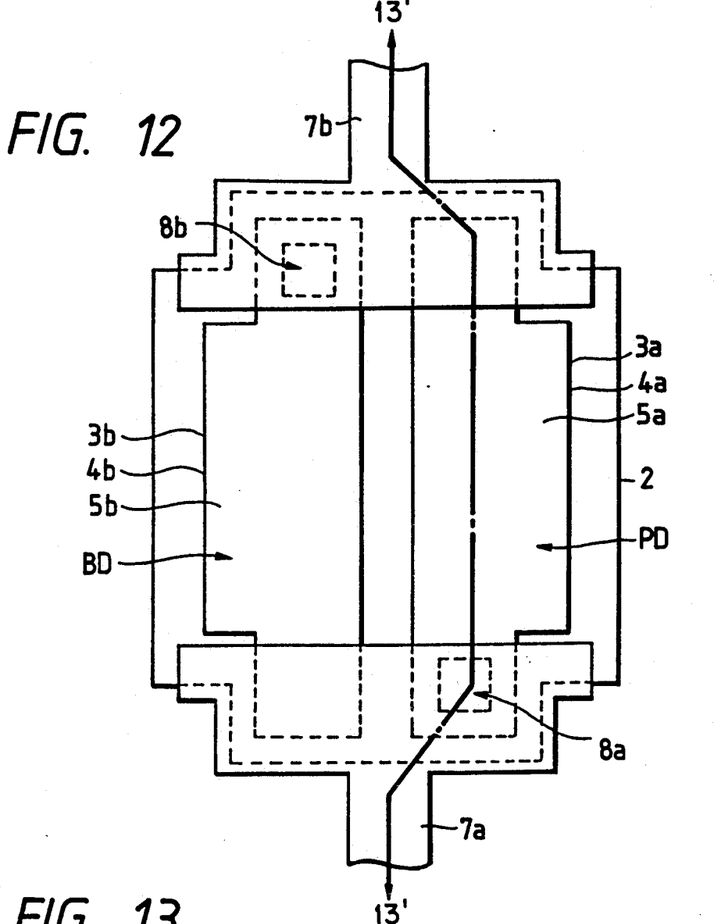
FIG. 12 is a plan view showing another light sensing element according to the present invention.
Figure 13:
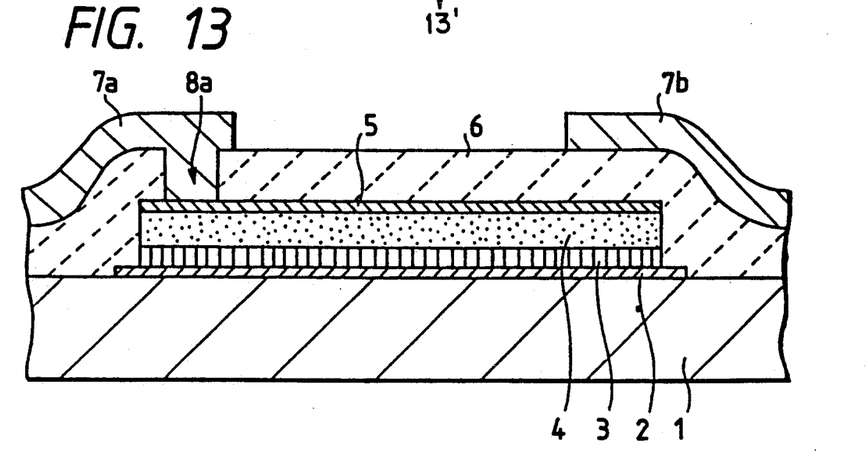
FIG. 13 is a cross sectional view taken on line 13'—13' in FIG. 12.

In the light sensing element in the present embodiment as described, the ohmic contact layers 3, photoconductive layers 4, and transparent electrodes 5 are disposed to be horizontally symmetrical as shown in FIG. 2. Another image sensor, which is designed allowing for a misalignment of patterns of the aluminum lead wires 7, will be described with reference to FIGS. 12 and 13. FIG. 12 is a plan view showing a light sensing element used in the image sensor and FIG. 13 is a cross sectional view taken on line 13′—13′ in FIG. 12. As shown, ohmic contact layers 3, photoconductive layers 4, and transparent electrodes 5, which are layered in this order on a metal electrode 2, are vertically disposed.

Figures 14, 15:
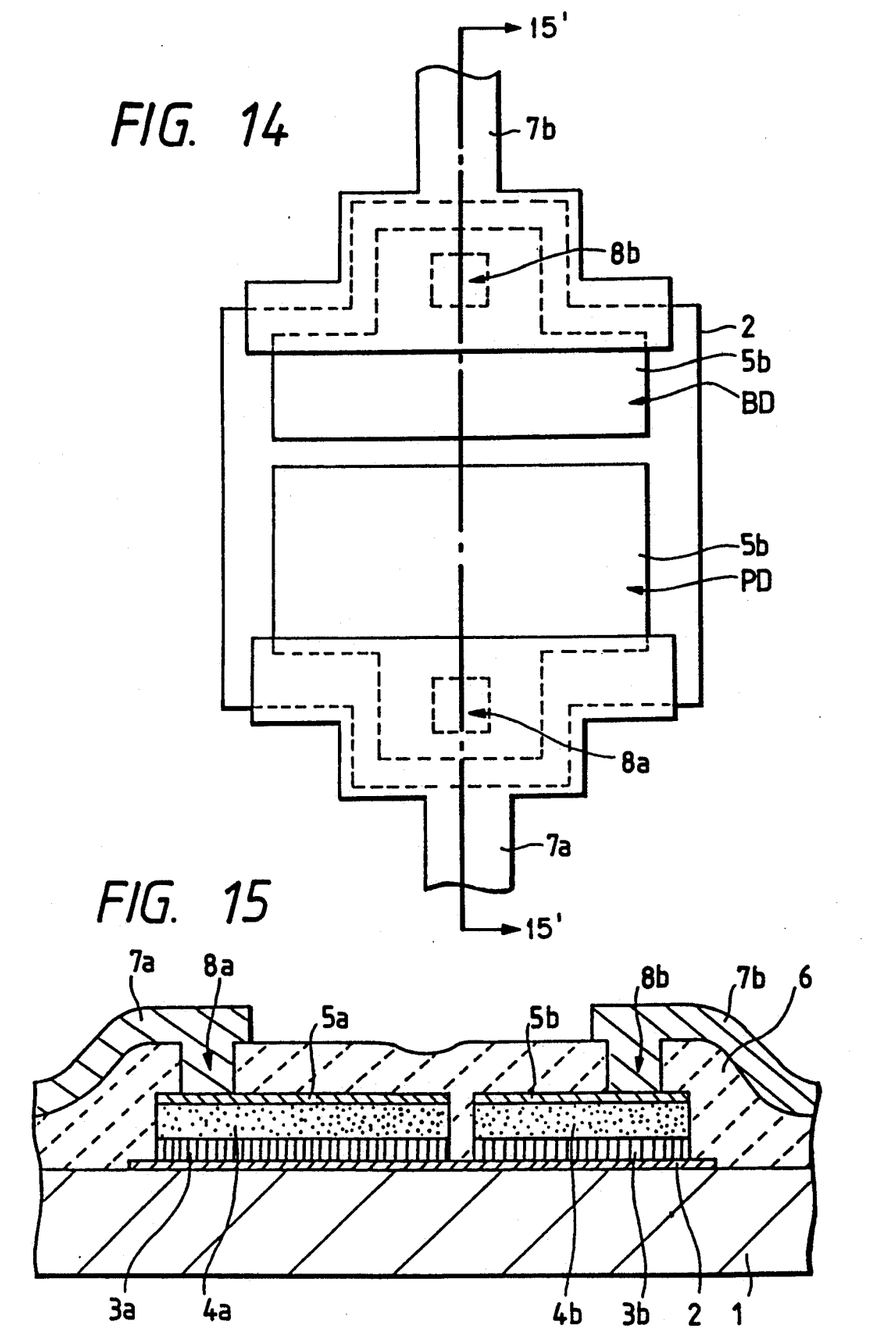
FIG. 14 is a plan view showing an additional light sensing element improved in its sensitivity.
FIG. 15 is a cross sectional view taken on line 15'—15' in FIG. 14.

When the image sensor in which a photo diode PD and a blocking diode BD are formed in one pixel area is compared with an image sensor of the type in which the blocking diode BD is not formed within the one pixel, the sensitivity of the former is half that of the latter. An image sensor succeeded in solving the above problem is shown in FIGS. 14 and 15. FIG. 14 is a plan view of a light sensing element used of the image sensor, and FIG. 15 is a cross sectional view taken on line 15′—15′ in FIG. 14. In the light sensing element, the photo diode area SPD>blocking diode area SBD.

As described above, according to an image sensor and a method of reading data out the same of the present invention, a potential, which depends on the charge of a pixel, is read out as a potential on the output line. The readout operation does not influence the other pixels on the same data line and is not influenced by the latter. Therefore, the circuit construction of the image sensor of the invention is simpler than the conventional image sensor of the current-readout type.

In the readout method of the invention, pixel charge is transferred to and stored in the load capacitor CL coupled with the common signal line every block of the light sensing elements. Therefore, it is easy to read out data for each block.

In the image sensor according to first aspect of the invention, a plurality of light sensing elements each consisting of a photo diode and a blocking diode make up a block. A plurality of blocks are arrayed into a light sensing element array. The blocking diodes are connected to a shift register for applying a bias voltage thereto. The lead wires from the photo diodes are connected to common signal lines each connecting to the light sensing elements within each block. The common signal lines are connected to a readout circuit. Each common signal line is provided with a load capacitor. With such an arrangement, the quantity of charge decreased as the result of the discharge by the photocurrent when the diode is exposed, is transferred to and stored in the load capacitor. Voltage caused in the common signal line by the charge of the load capacitor is read out for each block. The circuit construction for reading out the voltage is simpler than that for reading out the current.

In a method of reading out data according to the second aspect of the invention, data is read out of the image sensor. In the method, charge is distributed into the photo diode and the blocking diode according to the ratio of capacitance values thereof. When the light sensing elements are exposed to light, photocurrents flow therein according to the quantities of light, so that the photo diode and the blocking diode are discharged. The quantity of charge that is decreased as the result of the discharging operation is transferred to the load capacitor by turning on a bias voltage source contained in the shift register. Voltage caused in each common signal line as the charge transfer to the load capacitor, is read out. The circuit construction for reading out the voltage is simpler than that for reading out the current. Further, the data readout operation for each block is easy.

In a method of reading out data according to third aspect of the invention, data is out of the image sensor. In the method, charge is distributed into the photo diode and the blocking diode according to the ratio of capacitance values thereof, when the light sensing elements are exposed to light, photocurrents flow therein according to the quantities of light, so that the photo diode and the blocking diode are discharged, the quantity of charge that is decreased as the result of the discharging operation is transferred to the load capacitor by turning on a bias voltage source contained in the shift register, and voltage, which is proportional to the quantity of charge lost by the photocurrent flow, is left in the load capacitor by turning off the bias voltage source, whereby voltage is read out of the common signal line. The circuit construction for reading out the voltage is simpler than that for reading out the current. Further, the data readout operation for each block is easy.

What is claimed is:

1. An image sensor comprising:
   a light sensing element array including a plurality of blocks each consisting of a linear array of light sensing elements each consisting of a photo diode and a blocking diode being connected in back-to-back connection and constructed such that both the photo diode and the blocking diode receive light;
   common signal lines each connecting to a corresponding group of lead wires lead from the ends of the photo diodes in the light sensing elements, which are grouped for each block;
   a readout circuit connected to said common signal lines;
   a shift register for transferring a readout pulse to the ends of the blocking diodes of the light sensing elements for each block; and load capacitors being, respectively, continuously connected to said common signal lines.

2. The image sensor of claim 1, wherein the readout circuit includes:
a channel for each load capacitor; each channel comprising:
a first amplifier connected with the load capacitor;
a first capacitor connected in parallel to an output of the first amplifier;
a second amplifier connected in series to the first amplifier;
a second capacitor connected in parallel to an output of the second amplifier;
a third amplifier connected in series to the second amplifier; and
an output voltage follower coupled to an output of the third amplifier of each channel.

3. A method of reading data out of an image sensor which comprises a light sensing element array including a plurality of blocks each consisting of a linear array of light sensing elements each consisting of a photo diode and a blocking diode being connected in back-to-back connection and constructed such that both the photo diode and the blocking diode receive light, common signal lines each connecting to a corresponding group of lead wires lead from the ends of the photo diodes in the light sensing elements, which are grouped for each block, a readout circuit connected to said common signal lines, a shift register for transferring a readout pulse to the ends of the blocking diodes of the light sensing elements for each block, and load capacitors being, respectively, continuously connected to said common signal lines, said reading method comprising the steps of:
distributing charge into the photo diodes and the blocking diodes according to the ratio of capacitance values thereof;
discharging the photo diodes and the blocking diodes by flowing photocurrents according to quantities of light, when the light sensing elements are exposed to light;
transferring charge decreased by the discharging operation to the load capacitors by turning on a bias voltage source contained in the shift register;
reading out voltage which is caused in each common signal lines as the charge transfer to the load capacitors.

4. A method of reading data out of an image sensor which comprises a light sensing element array including a plurality of blocks each consisting of a linear array of light sensing elements each consisting of a photo diode and a blocking diode being connected in back-to-back connection and constructed such that both the photo diode and the blocking diode receive light, common signal lines each connecting to a corresponding group of lead wires lead from the ends of the photo diodes in the light sensing elements, which are grouped for each block, a readout circuit connected to said common signal lines, a shift register for transferring a readout pulse to the ends of the blocking diodes of the light sensing elements for each block, and load capacitors being, respectively, continuously connected to said common signal lines, said reading method comprising the steps of:
distributing charge into the photo diodes and the blocking diodes according to the ratio of capacitance values thereof;
discharging the photo diodes and the blocking diodes by flowing photocurrents according to quantities of light, when the light sensing elements are exposed to light;
transferring charge decreased by the discharging operation to the load capacitors by turning on a bias voltage source contained in the shift register;
reading out voltage which is proportional to the quantity of charge lost by the photocurrent flow, and is left in the load capacitors by turning off the bias voltage source, whereby voltage is read out of the common signal lines.

* * * * *